United States Patent [19]

Van Deuren

[11] Patent Number: 4,527,327
[45] Date of Patent: Jul. 9, 1985

[54] DEVICE FOR TRANSFERRING AN ELECTRIC OR ELECTRONIC COMPONENT TO A MOUNTING BOARD

[75] Inventor: Fransiscus H. Van Deuren, Eindhoven, Netherlands

[73] Assignee: U.S. Philips Corporation, New York, N.Y.

[21] Appl. No.: 481,196

[22] Filed: Apr. 1, 1983

[30] Foreign Application Priority Data

Apr. 16, 1982 [NL] Netherlands .................. 8201593

[51] Int. Cl.³ .................. B23P 19/00; H05K 3/32
[52] U.S. Cl. .................. 29/740; 29/743; 29/759; 29/840
[58] Field of Search ............. 29/740, 741, 743, 759, 29/834, 840; 228/6 A, 6 R

[56] References Cited
U.S. PATENT DOCUMENTS

| | | | |
|---|---|---|---|
| 4,327,482 | 5/1982 | Araki et al. | 29/740 |
| 4,381,601 | 5/1983 | Tamai et al. | 29/740 |
| 4,438,559 | 3/1984 | Asai et al. | 29/740 |

*Primary Examiner*—Carl E. Hall
*Attorney, Agent, or Firm*—David R. Treacy

[57] ABSTRACT

A device for transferring an electric or electronic component to a mounting board comprises a suction tube for picking up the component and gripping means with two pairs of jaws for aligning and centering the component, this suction tube being movable with respect to the gripping means. The device further has a holder in which the suction tube is arranged so as to be axially movable, while the jaws of the gripping means are secured to a support which is axially movable with respect to the holder. An abutment of the suction tube can axially displace the support of the jaws, while with the aid of adjusting members present in the holder two oppositely arranged jaws reach the closed position earlier than the two other jaws.

7 Claims, 6 Drawing Figures

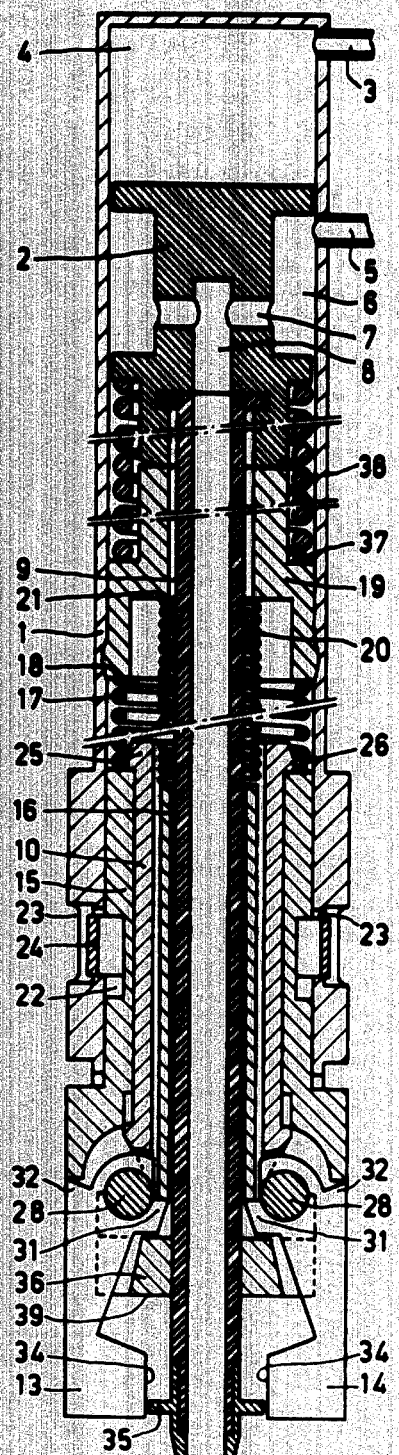
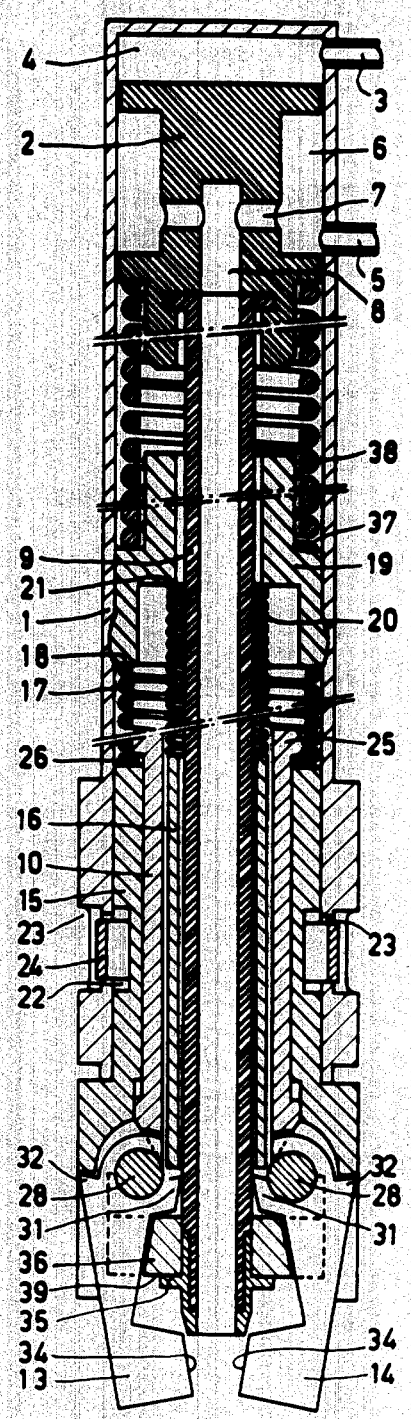
FIG. 1
FIG. 2

DEVICE FOR TRANSFERRING AN ELECTRIC OR ELECTRONIC COMPONENT TO A MOUNTING BOARD

BACKGROUND OF THE INVENTION

The invention relates to a device for transferring an electric or electronic component to a mounting board; and more particularly to such a device comprising a suction tube for picking up the component, and gripping means with two pairs of jaws for aligning and centering the component. The suction tube is usually movable axially with respect to the gripping means.

The device is particularly suitable for transferring very small electric or electronic components of a prismatic shape without connection wires having dimensions of the order of up to a few millimeters. These are commonly called chip-type components. These components are supplied in a packaged state, for example, in tubular magazines or in strip-shaped supports. The transferring device picks up a component, transports it to a mounting board and positions it on the board.

It is known to center the electric or electronic component with respect to the suction tube by operating the two pairs of jaws simultaneously. However, difficulties can arise in centering the component. An angular rotation of the component cannot be readily eliminated because the component then cannot rotate freely. Centering of the component in one direction can be adversely affected by a simultaneous centering in another direction. Moreover, the dimensions of the known device are comparatively large and the construction is complicated. This device is therefore not suitable to place several components simultaneously near each other on a mounting board.

SUMMARY OF THE INVENTION

The object of the invention has is to provide a transfer device which can centers component without difficulty, and which has a comparatively simple construction and small dimensions so that a number of these devices can be arranged at a short relative distance from each other. With such a device components can be placed in close proximity to each other.

According to the invention, the device is provided with a holder in which the suction tube is arranged so as to be axially movable, while the jaws of the gripping means are pivotally secured to a support which, also is axially movable with respect to the holder; and the suction tube has an abutment with whose aid the support of the jaws can be moved to cooperate with adjusting members in the holder so that two oppositely arranged jaws reach the closed position earlier than the two other jaws.

In a preferred embodiment of the invention, the jaws are pivotally arranged in the support and each comprise an inner lever and an outer lever, the inner levers of the jaws co-operating with an adjusting member in the form of a spring-loaded axially movable tubular body surrounding the suction tube for opening the jaws, and the outer levers of one pair of jaws can be actuated by means of a second adjusting member in the form of a spring-loaded axially movable tubular member and the outer levers of the other pair of jaws can be actuated by an abutment in the holder for closing the jaws. In this embodiment, it is rendered possible in a comparatively simple manner to cause the pairs of jaws to be closed successively.

An embodiment of the invention will be described more fully with reference to the drawing.

BRIEF DESCRIPTION OF THE DRAWING

In the drawing:

FIG. 1 is a longitudinal sectional view of a device in accordance with the invention, showing one of the pairs of jaws in the opened position, FIG. 2 is a sectional view similar to FIG. 1, in which the pairs of jaws are closed.

DESCRIPTION OF THE PREFERRED EMBODIMENT

Figure 3:
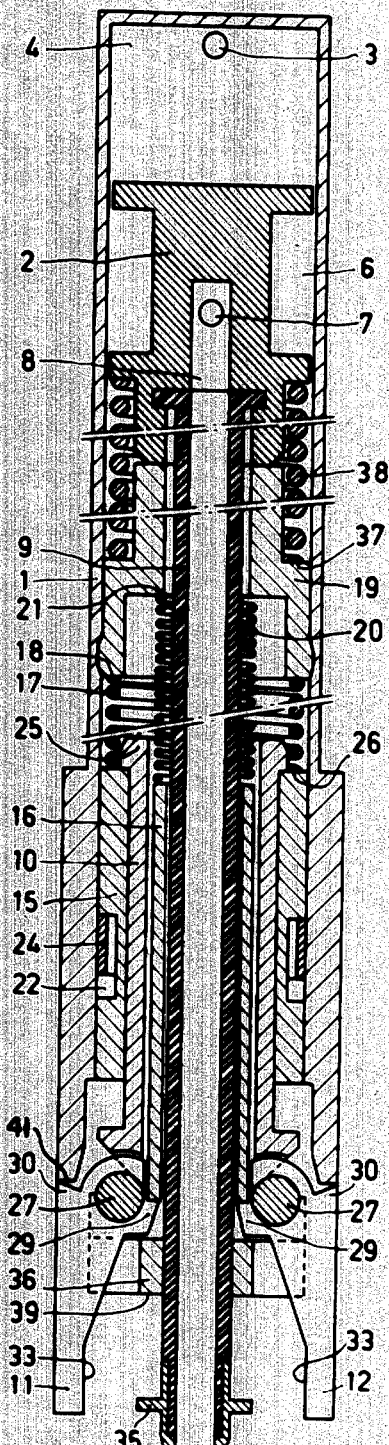
FIG. 3 is a sectional view of the other pair of jaws of the device of FIG. 1 in the opened position.
Figure 4:
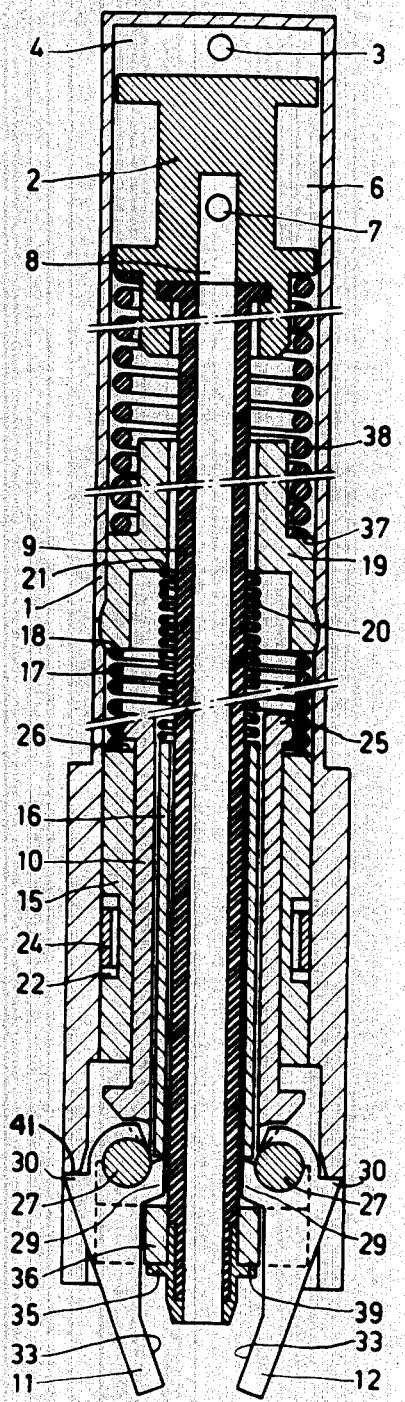
FIG. 4 is a sectional view similar to FIG. 3, in which the pairs of jaws are closed.

FIGS. 1-4 show the device in a longitudinal sectional view. A holder 1 constitutes the outer structural member of the device. The holder 1 has a tubular shape which encloses a plunger 2. Through one or more openings 3 in the holder, compressed air can be supplied to the end 4 of the plunger. Through one or more openings or vacuum connections 5, a subatmospheric pressure can be produced in the space 6 of the plunger. This space 6 is connected through a bore 7 to a longitudinal bore 8 of the plunger. In the longitudinal bore 8 there is secured a tube 9 which can be used as a suction tube.

Figure 5:
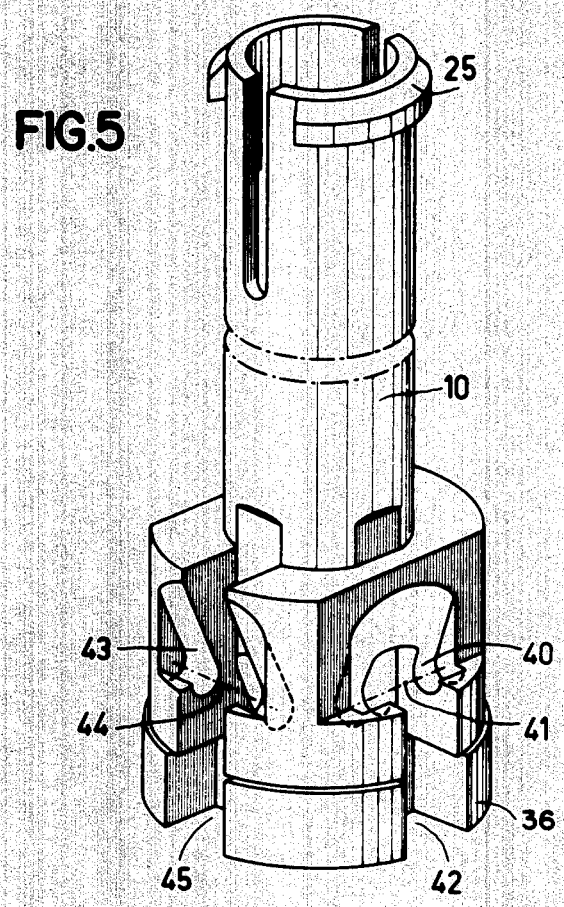
FIG. 5 is a perspective view of the support of the jaws of the gripping means.

A support 10, to which jaws 11, 12, 13 and 14 of gripping means are secured, is also arranged co-axially in the holder 1. The support 10 is shown in FIG. 5 in a perspective view. In FIGS. 1-4 the part of the support 10 supporting the jaws is shown in a simplified form for the sake of clarity.

The support 10 is axially movable with respect to a first tubular adjusting member 15 which surrounds part of the length of the support and guides the relative axial movement of the support. A second tubular adjusting member 16 surrounds a part of and is axially movable with respect to the suction tube 9. The adjusting member 15 is loaded downwardly by a spring 17 which bears on an abutment 18 of a spring support 19 fixedly secured to the holder 1. A spring 20 is located between an abutment 21 of the spring support and the top end face of the adjusting member 16. The adjusting member 15 is provided with an annular recess 22, while the holder 1 is provided with two openings 23 (FIG. 1, 2). A slightly flattened annular spring 24 is located in the recess 22 and projects into the openings 23 and thus limits the axial displacement of the adjusting member 15 with respect to the holder 1.

The support 10 is provided at one end with an abutment in the form of a hook-shaped thickened part or flange 25 cooperating with an abutment in the form of an end face 26 in the adjusting member 15. Thus, the axial sweep of the support 10 is limited.

The jaws 11 and 12 included in the support 10 (FIG. 3 and 4) are each pivotally connected to the support by a respective shaft 27 which can rotate in the support. The jaws 13 and 14 (FIG. 1 and 2) are each similarly connected to the support through a respective shaft 28 which also can rotate in the support. The shafts 27 are located in recesses 40 (see FIG. 5) of the support 10. The axis of rotation is indicated by a dot-and-dash line 41. The jaws 11, 12 can pivot radially with respect to the support axis in the slits 42 in the enlarged bottom part 36 of the support 10. The shafts 28 are similarly located in recesses 43; their axis of rotation is indicated by a dot-and-dash line 44 and the jaws 13, 14 can move radially inward or outward in the slits 45. The jaws 11 and 12 have an inner lever arm 29 and an outer lever arm 30. The jaws 13 and 14 have a similar inner lever arm 31 and an outer lever arm 32. The jaw parts 33 and 34 at the lower ends of the jaws serve to center and hold a component.

Figure 6:
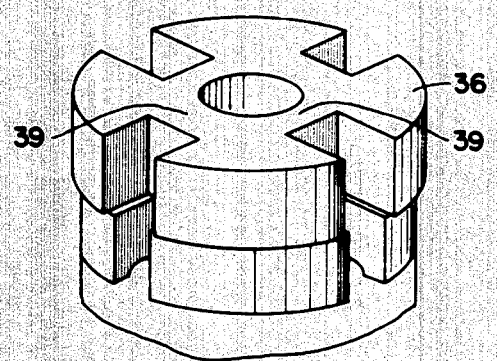
FIG. 6 is a perspective bottom view of a portion of the support shown in FIG. 5.

The suction tube 9 is provided near its lower end having a sleeve with an annular flange 35. Upon axial movement of the suction tube upward the flange 35 can engage the the end face 39 of the bottom part 36 (FIG. 5) of the support 10 of the jaws. Thus, the support 10 can be axially moved by means of the suction tube. The end face 39 is shown in FIGS. 1-4 and is also indicated in the bottom view of FIG. 6.

The spring support 19 has an abutment 37 on the side remote from the jaws. Between this abutment 37 and the plunger 2 a spring 38 exerts a force on the plunger in a direction away from the jaws.

The operation of the device will now be described.

In the opened position shown in FIGS. 1 and 3, air under pressure is admitted through the opening 3. The plunger 2 has moved in the direction of the jaws against the pressure of the spring 38. The suction tube 9 has therefore been then moved downward so that with its end is beyond the jaws.

The adjusting member 15 is pressed by the spring 17 towards the jaws. However, the adjusting member 15 is arrested in the position shown by the spring 24, which has been moved downward in the openings 23 to its extreme position (see FIG. 1). The second adjusting member 16 is pressed by the spring 20 towards the jaws so that the end of the adjusting member 16 abuts against the inner lever arms 29, 31 of the jaws 11, 12 and 13, 14, respectively. Since the outer lever arms 30 abut against the lower end 41 of the holder 1 (FIG. 3) and the outer lever arms 32 abut against the end of the adjusting member 15 (FIG. 1), the adjusting member 16 will open the jaws, the support 10 being moved in downward direction until the flange 25 abuts against the abutment surface 26 of the adjusting member 15. This corresponds to the opened position, in which the whole device may still be moved downwards to the place at which an electric or electronic component to be picked up is present, which component has to be transferred to another position with the aid of the device.

In order to be able to pick up the component (not shown) for example, a rectangular electronic component, a subatmospheric pressure may be produced in the suction tube through the vacuum connection 5 in the holder 1. The component now picked up by the suction tube 9 can be raised, for example, by reducing the pressure of the compressed air on the plunger 2, the spring 38 then pressing the plunger in an upward direction. For the time being, only the position of the suction tube 9 is then changed.

When the suction tube moves further upwards, the annular flange member 35 engages the end face 39 of the support 10 of the jaws, and the support 10 is taken along in the upward movement. The jaws start to close, in which process first the jaws 13, 14 grip the long side of the component; the component is then aligned and centered in the longitudinal direction. The alignment and centering take place without problems, in part because the jaws 11, 12 which are not yet closed, leaving the component free to move in the transverse direction. When the suction tube 9 is moved further upwards, the support 10 can still follow this movement. This is due to the fact that the closed jaws 13, 14, which bear with their lever arms 31 and 32, respectively, against the adjusting members 16 and 15, respectively, (FIGS. 1, 2) can take these adjusting members along in this movement against the pressure of the springs 20 and 17.

Meanwhile, the jaws 11, 12 close and center the component in its transverse direction. The jaws 11 and 12 are closed because the support 10 still moves upwards and the jaws, which bear with their outer lever arms 30 against the stationary end of the holder 1, are forced to follow the resulting pivoting of the shaft 27. When the jaws 11 and 12 have been closed, the stationary end 41 of the holder 1 prevents further movement of the support 10 with respect to the holder. The position shown in FIG. 2 and 4 has now been reached.

An accurate alignment and centering of the rectangular component is now obtained and the jaws hold the component in this position, even if the subatmospheric pressure in the suction tube is eliminated.

The component now centered and held by the jaws can then be transferred with the aid of the device to above a mounting plate, where the component has to be placed, for example, on a mounting board. Means for positioning the device accurately above the mounting plate are not essential to the invention and are not described here more fully.

In order to provide the component on the mounting board, the suction tube has now to be moved downwards. Air under pressure is then admitted again through the opening 3 above the plunger 2 and subatmospheric pressure is maintained in the suction tube 9. The movement of the annular flange 35 makes it possible for the support 10 to follow the tube movement in the downward direction. The jaws 11, 12 then start to open, but the jaws 13, 14 remain closed. This is due to the fact that the adjusting member 16 does not yet bear against the lever arms 31 whereas the adjusting member 15 does bear against the lever arms 32. When the adjusting member 15 has followed the movement to such an extent that its further movement is prevented by the annular spring 24, the adjusting member 16 will open the jaws 13, 14. The electric component is now held only by the suction tube 9. The support 10 can move on until the flange 25 abuts the abutment 26 of the adjusting member 15. The jaws are then fully opened. The suction tube 9 can now be moved still further downwards until the component has been placed on the mounting board. The suction tube is then moved upwards again and the device is transferred to above the place at which a next component is to be picked up, whereupon the cycle can be repeated.

For the sake of clarity, the device described is shown on a greatly enlarged scale. In fact, the device may have an outer diameter of the holder 1 of the order of 5 mm. With such a dimension, for example, rectangular components having dimensions between $1.1 \times 1.8$ mm and $1.8 \times 3.4$ mm can be moved. The height may vary considerably. It is also possible to arrange several of these devices in a supporting member in relatively adjusted positions so that a number of components can be simultaneously picked up and transferred to their respective mounting places. The components are allowed to have different dimensions. Due to the fact that the outer diameter of the holder may be small, the components may consequently be provided simultaneously on the mounting board in close proximity to each other.

What is claimed is:

1. A device for transferring a component, comprising a suction tube for picking up a component,
   gripping means for aligning and centering the component, said means comprising two pairs of oppositely arranged jaws, and
   a holder in which said suction tube is axially movable with respect to the holder and the gripping means,
   characterized by comprising means for opening and closing said jaws in response to movement of the tube with respect to the holder, said means comprising
   a support in which the jaws are pivotally mounted, said support being movable axially with respect to the holder,
   an abutment on said tube,
   means engageable by said abutment for moving the support in response to movement of the tube, and
   means for closing said jaws in response to movement of the support with respect to the holder, said means including means for closing one pair of jaws earlier than the other.

2. A device as claimed in claim 1, characterized in that said means for closing comprises two adjusting members axially movable with respect to each other and to the support, relative movement between the first adjusting member in a given direction relative to the support closing one pair of jaws only, and movement of the second adjusting member relative to said support in a direction opposite said given direction opening both pairs of jaws.

3. A device as claimed in claim 2, characterized in that each jaw comprises a respective inner lever arm and a respective outer lever arm, each of said jaws being opened by abutment of said second adjusting member with a respective inner lever arm, and each of said jaws being closed by abutment of the respective outer lever arms with a surface of said first adjusting member.

4. A device as claimed in claim 3, characterized in that said first adjusting member comprises means for limiting relative movement with respect to said holder in the direction which tends to close said one pair of jaws.

5. A device as claimed in claim 4, characterized in that said first adjusting member comprises an abutment surface which engages an abutment surface on said support to limit axial movement of the support in a direction away from the holder when the jaws are open.

6. A device as claimed in claim 2, characterized in that said first adjusting member comprises an abutment surface which engages an abutment surface on said support to limit axial movement of the support in a direction away from the holder when the jaws are open.

7. A device as claimed in claim 6, characterized in that said first adjusting member comprises means for limiting relative movement with respect to said holder in the direction which tends to close said one pair of jaws.

* * * * *